United States Patent [19]
Bean

[11] 3,933,682
[45] Jan. 20, 1976

[54] PHOTOPOLYMERIZATION CO-INITIATOR SYSTEMS

[75] Inventor: Anthony J. Bean, East Rutherford, N.J.

[73] Assignee: Sun Chemical Corporation, New York, N.Y.

[22] Filed: Oct. 31, 1974

[21] Appl. No.: 519,579

Related U.S. Application Data

[63] Continuation-in-part of Ser. No. 328,442, Jan. 31, 1973, abandoned.

[52] U.S. Cl. .......... 252/431 R; 252/426; 252/431 C; 252/431 N; 204/159.23; 204/159.24

[51] Int. Cl.² .......... B01J 31/02; B01J 31/12

[58] Field of Search .......... 252/426, 431 R, 431 C, 252/431 N, 431 P; 204/159.23, 159.24

[56] References Cited

UNITED STATES PATENTS

| | | | |
|---|---|---|---|
| 2,448,828 | 9/1948 | Renfrew | 252/426 X |
| 3,222,429 | 12/1965 | Boyd et al. | 252/426 X |
| 3,352,772 | 11/1967 | Mao | 204/159.24 |
| 3,551,311 | 12/1970 | Nass et al. | 204/159.23 X |
| 3,729,404 | 4/1973 | Morgan | 204/159.24 X |
| 3,759,807 | 9/1973 | Osborn et al. | 204/159.23 |

FOREIGN PATENTS OR APPLICATIONS

| | | | |
|---|---|---|---|
| 1,156,460 | 6/1969 | United Kingdom | 252/426 |

*Primary Examiner*—Patrick P. Garvin
*Attorney, Agent, or Firm*—Cynthia Berlow

[57] ABSTRACT

A photopolymerization co-initiator system comprises (a) about 1–30 parts of at least one carbonyl-containing compound, (b) about 1–30 parts of an organic compound containing nitrogen, phosphorus, arsenic, bismuth, or antimony, and (c) about 1–30 parts of at least one halogenated hydrocarbon.

2 Claims, No Drawings

PHOTOPOLYMERIZATION CO-INITIATOR SYSTEMS

This application is a continuation-in-part of application Ser. No. 328,442, filed Jan. 31, 1973, now abandoned.

This invention relates to photopolymerization initiators. More particularly it relates to photoinitiator systems which comprise a carbonylcontaining compound, an organic functional compound of an element of Group V of the Periodic Table, and a halogenated hydrocarbon.

The use of photopolymerizable monomeric ethylenically unsaturated materials in coating compositions, printing inks, adhesives, and the like is known. It is also known that such monomeric materials are converted into polymers by the action of radiation and that they will polymerize at an improved rate when exposed to radiation in the presence of a photoinitiator.

The use of such photopolymerizable compositions in inks, coatings, adhesives, and presensitized photopolymeric printing plates has been described in, for example, U.S. Pat. Nos. 3,551,235; 3,551,246; 3,551,311; 3,558,387; and 3,759,809. While these products possessed good flexibility, chemical resistance, abrasion resistance, gloss, adhesion, color, and the like, it has now been found that these properties can be retained while at the same time speeding up the cure rate by using as the photoinitiator a mixture of a compound containing a carbonyl group, an organic functional compound of an element of Group V of the Periodic Table, and a halogenated hydrocarbon.

The photoinitiator of this invention is a combination of a. at least one compound containing a carbonyl group and having the formula

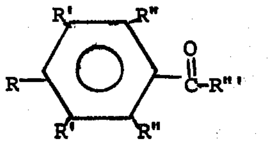

wherein R, R′, and R″ is each hydrogen, $C_{1-14}$ alkyl, aryl, alkylaryl, alkoxy, aryloxy, halogen, halogenated $C_{1-14}$ alkyl, halogenated aryl, amino, or amino N-substituted with alkyl, aryl, β-alkanol, or a combination of these, and may be the same or different; and R‴ is hydrogen, $C_{1-14}$ alkyl, halogenated alkyl, aryl, -OZ where Z is $C_{1-14}$ alkyl or aryl;

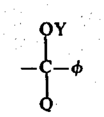

where Y is hydrogen, $C_{1-14}$ alkyl, aryl, or alkylaryl and Q is hydrogen, $C_{1-14}$ alkyl, aryl, alkylaryl, alkoxy, or aryloxy; or

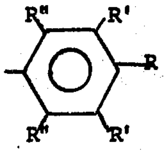

wherein R, R′, and R″ is each hydrogen, $C_{1-14}$ alkyl, aryl, alkylaryl, alkoxy, aryloxy, halogen, halogenated $C_{1-14}$ alkyl, halogenated aryl, amino, or amino N-substituted with alkyl, aryl, β-alkanol, or a combination of these, and may be the same or different; examples of component (a) include but are not limited to acyloins, such as benzoin; acyloin derivatives, such as benzoin methyl ether and benzoin ethyl ether; ketones, such as benzophenone, acetophenone, ethyl methyl ketone, cyclopentanone, benzil, caprone, benzoyl cyclobutanone, dioctyl acetone, 4,4′-benzoyl biphenyl, and the like; substituted benzophenones, such as Michler's ketone and halogenated aceto-and benzophenones; aldehydes, such as benzaldehyde, dimethylaminobenzaldehyde, 4-hydroxy-3-methoxybenzaldehyde, 3,4-methylenedioxybenzaldehyde, o- and p-hydroxybenzaldehydes, naphthaldehyde, and cinnamaldehyde; and the like; and mixtures thereof;

b. at least one organic compound of a Group V element having the formula

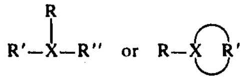

wherein X is nitrogen, phosphorus, arsenic, bismuth, or antimony and R, R′, and R″ is each alkyl, hydroxyalkyl, aryl, aralkyl, or alkaryl and may be the same or different and one or both of R and R″ may be hydrogen; examples of component (b) include but are not limited to diethanolamine, triethanolamine, dimethylphosphine, trimethylphosphine, tributylphosphine, triphenylphosphine, dibutylphenylphosphine, methyldiphenylphosphine, methylbutylphenylarsine, trioctylarsine, dibutylphenylbismuthine, triphenylstibene, methylbutylphenylstibene, dibutylphenylstibene, piperidine, p-piperidino acetophenone, N-hydroxyethylpiperidine, N-ethylmorpholine, N-hydroxyethylmorpholine, dipiperidinomethane, 1,3-di-(N-beta-hydroxyethyl-4-piperidyl)propane, 1,3-di-4-piperidylpropane, 4-benzoylpyridine, N-hydroxyethylpiperidine, and the like, and mixtures thereof; and c. at least one halogenated aliphatic, alicyclic, and aromatic hydrocarbon in which the halogen may be chlorine, bromine, fluorine, or iodine, such as for example polyhalogenated hydrocarbons such as polychlorinated triphenyl and polyfluorinated phenyls, halogenated polyolefins such as chlorinated polyethylene and chlorinated polypropylene, chlorinated rubbers such as the Parlons (Hercules, Inc.), copolymers of vinyl chloride and vinyl isobutyl ether such as Vinoflex MP-400 (BASF Colors and Chemicals, Inc.), chlorinated aliphatic waxes such as Chlorowax 70 (Diamond Alkali, Inc.), chlorinated paraffins such as Chlorafin 40 (Hooker Chemical Co.) and Unichlor-70B (Neville Chemical Co.), mono- and polychlorobenzenes, mono- and polybromobenzenes, mono- and polychloroxylenes, mono- and polybromoxylenes, dichloromaleic anhydride, 1-(chloro-2-methyl) naphthalene, 2,4-dimethylbenzene sulfonyl chloride, 1-bromo-3-(m-phenoxyphenoxy) benzene, 2-bromoethyl methyl ether, chlorendic anhydride and its corresponding esters, chloromethyl naphthyl chloride, chloromethyl naphthalene, bromoethyl phenanthrene, diiodomethyl anthracene, hexachlorocyclopentadiene, hexachlorobenzene, hexachloroparaxylene, and the like, and mixtures thereof.

The ratio of the amounts of the components of the photoinitiator system (a): (b):(c) is about 1–30: 1–30: 1–30, and preferably about 2–15: 2–10: 1–5.

The photoinitiator system of this invention may be used in compositions with any suitable monomeric ethylenically unsaturated compound, such as the mono- or polyester, e.g., the acrylate, methacrylate, itaconate, cinnamate, or sorbate of an alkylene glycol, alkoxylene glycol, alicyclic glycol, and higher polyol such as ethylene glycol, triethylene glycol, tetraethylene glycol, tetramethylene glycol, butanediol, pentanediol, hexanediol, octadiol, trimethylolethane, trimethylolpropane, pentaerythritol, dipentaerythritol, sorbitol, d-mannitol, diols of unsaturated fatty acids, and the like, as well as modified acrylates, methacrylates, and itaconates; acrylated, methacrylated, and itaconated prepolymers, e.g., epoxy resins, oil and oil-free alkyd resins, urethanes, linear polyesters, and so forth; and the like, and mixtures thereof.

Typical compounds include, but are not limited to, hydroxyethyl acrylate, hydroxyethyl methacrylate, hydroxyhexyl acrylate, trimethylolpropane triacrylate, trimethylolethane triacrylate, trimethylolpropane trimethacrylate, trimethylolethane trimethacrylate, tetramethylene glycol dimethacrylate, ethylene glycol dimethacrylate, triethylene glycol dimethacrylate, tetraethylene glycol diacrylate, tetraethylene glycol dimethacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexacrylate, tripentaerythritol octoacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol dimethacrylate, 1,3-butanediol diacrylate, 1,3-butanediol dimethacrylate, 1,4-butanediol diitaconate, sorbitol triacrylate, sorbitol tetraacrylate, sorbitol tetramethacrylate, sorbitol pentaacrylate, sorbitol hexacrylate, modified 1,4-butylene diacrylate, modified trimethylolpropane triacrylate, modified pentaerythritol triacrylate, methacrylated epoxy resin, and the like, and mixtures and prepolymers thereof.

The ratio of the amount of the monomeric compound to the amount of the photoinitiator system is about 1–1,000 to 1, and preferably is about 10–50 to 1.

Commonly known modifiers may be incorporated into the formulations using these compositions, including colorant; plasticizers; wetting agents for the colorant, such as dichloromethylstearate and other chlorinated fatty esters; leveling agents, such as lanolin, paraffin waxes, and natural waxes; and the like. Such modifiers are generally used in amounts ranging up to about 3 per cent by weight, preferably about 1 per cent, based on the total weight of the formulation.

The formulations may be prepared in any known and convenient manner.

The rate at which the photopolymerizable composition will dry varies with the nature of the substrate, the specific ingredients in the composition, the concentration of the photoinitiator, the thickness of the material, the nature and intensity of the radiation source and its distance from the material, the presence or absence of oxygen, and the temperature of the surrounding atmosphere. Irradiation may be accomplished by any one or a combination of a variety of methods; for example, the composition may be exposed to actinic light from any source and of any type as long as it furnishes an effective amount of ultraviolet radiation, since the compositions activatable by actinic light generally exhibit their maximum sensitivity in the range of about 1,800A, to 4,000A, and preferably about 2,000A to 3,000A; electron beams; gamma radiation emitters; and the like; and combinations of these. Suitable sources include, but are not limited to, carbon arcs, mercury vapor arcs, pulsed xenon lamps, fluorescent lamps with special ultraviolet light-emitting phosphors, argon glow lamps, photographic flood lamps, and so forth.

The time of irradiation must be sufficient to give the effective dosage and irradiation may be carried out at any convenient temperature; most suitably it is carried out at room temperature for practical reasons. Distances of the radiation source from the work may range from about 1 inch to 6 feet, and preferably about 5 inches to 4 feet.

When cured by radiation, the compositions of this invention are dry, flexible, abrasion resistant, and chemical resistant; also they have excellent ink receptivity, hydrophilic-hydrophobic balance, dot resolution, and initial roll-up, making them particularly suitable in such applications as presensitized lithographic printing plates and photoresists. The compositions are also useful as printing inks; adhesives for foils, films, papers, fabrics, and the like; coating for metals, plastics, paper, wood, foils, textiles, glass, cardboard, box board, and the like; and so forth.

When used as vehicles for inks, e.g., printing inks, the compositions may be pigmented with any of a variety of conventional organic or inorganic pigments, e.g., molybdate orange, titanium white, chrome yellow, phthalocyanine blue, and carbon black, as well as colored with dyes in a conventional amount. For example, the vehicle may be used in an amount ranging from about 20 to 99.9 per cent and the amount of colorant may range from about 0.1 to 80 per cent of the weight of the total composition.

Stock which may be printed includes paper, clay-coated paper, and various types of box board. In addition, the compositions of the present invention are suitable for the treatment of textiles, both natural and synthetic, e.g., in vehicles for textile printing inks or for specialized treatments of fabrics to produce water repellency, oil and stain resistance, crease resistance, etc.

When photopolymerizable materials using the initiators of the present invention are used as adhesives, at least one of the substrates must be translucent or transparent when ultraviolet light is used. When the radiation source is an electron beam or gamma radiation, at least one of the substrates must be capable of transmitting high energy electrons or gamma radiation, respectively, and neither is necessarily translucent to light. Typical laminations include polymer-coated cellophane to polymer-coated cellophane films, polymer-coated cellophane to polypropylene, Mylar to a metal substance such as aluminum or copper, polypropylene to aluminum, and the like.

Photopolymerizable compositions using the initiators of the present invention may be utilized for metal coatings and particularly for metals which are subsequently to be printed. Glass and plastics may also be printed or coated, and the coatings are conventionally applied by roller or spray. Pigmented coatings systems may be used for various polyester and vinyl films; glass; polymer-coated cellophane; treated and untreated polyethylene; treated and untreated polypropylene; and the like. Examples of metals which may be coated include sized and unsized tin plate.

Photopolymerizable elements prepared from compositions including the initiators of this invention comprise a support, e.g., a sheet or plate, having superimposed thereon a layer of the above-described photopolymerizable compositions. Suitable base or support materials include metals, e.g., steel and aluminum plates; sheets; and foils; and films or plates composed of various film-forming synthetic resins or high polymers, such as addition polymers, and in particular vinyl polymers, e.g., vinyl chloride polymers; vinylidene chloride polymers; vinylidene chloride copolymers with vinyl chloride, vinyl acetate, or acrylonitrile; linear condensation polymers such as a polyester, e.g., polyethylene terephthalate; polyamides; etc. Fillers or reinforcing agents can be present in the synthetic resin or polymer bases.

Photopolymerizable elements can be made by exposing to radiation selected portions of the photopolymerizable layer thereof until polymerization is completed to the desired depth in the exposed portions. The unexposed portions of the layer are then removed, e.g., by the use of solvents which dissolve the monomer or prepolymer but not the polymer.

When used in photopolymerizable elements, the optimum dry coating thickness of the photocurable composition is about 0.2 to 0.4 mil. Flexibility decreases with thicker films and abrasion resistance decreases with thinner films.

When used as printing inks, coating compositions, and adhesives, the photopolymerizable compositions are used without volatile solvents and possess many advantages over conventional oleoresinous and solvent-type inks and coatings. The substrate need not be pretreated or prepared in any way. The use of volatile solvents and the attendant hazards and air pollution are eliminated. The inks and coatings have excellent adhesion to the substrate after exposure to radiation. They have good gloss and rub-resistance and withstand temperatures as high as about 150°C. and as low as about −20°C. The printed or coated sheets can be worked and turned immediately after exposure to the energy source.

The invention and its advantages will be better understood with reference to the following illustrative examples, but it is not intended to be limited thereto. In the examples, the parts are given by weight unless otherwise specified. Unless otherwise indicated, when the ingredient is solid at room temperature, the mixture may be heated to melt the solid ingredient, but generally not above 100°C., or it may be used in a mixture with other liquid ingredients. The atmospheric and temperature conditions were ambient unless otherwise noted.

The samples were prepared as follows: 0.2 gram of the ester-photoinitiator composition was rolled onto a 2 ¼ inch × 8 ½ inch glass plate, using a "Quick-Peak" roller in order to form a uniform film. The wet film was then transferred to a 1 inch × 3 inch glass slide which was then exposed to consecutive 0.1-second flashes of a 100 watt/inch ultraviolet lamp until the composition was tack-free, as determined by rubbing the film with a finger.

EXAMPLES 1–8

TABLE I

| Composition, per cent by weight | Example 1 | 2 | 3 | 4 | 5 | 6 | 7 | 8 |
|---|---|---|---|---|---|---|---|---|
| Pentaerythritol tetraacrylate | 100 | 95 | 95 | 95 | 95 | 95 | 95 | 95 |
| Benzophenone | — | 5 | — | — | 3 | — | 3 | 2 |
| Triethanolamine | — | — | 5 | — | 2 | 3 | — | 2 |
| α-6-hexachloroparaxylene | — | — | — | 5 | — | 2 | 2 | 1 |
| Cure speed, seconds | 30 | 15 | 4.5 | 1.5 | 2.5 | 3.0 | 10 | 0.7 |

From these data it can be seen that the cure speed of pentaerythritol tetraacrylate with a combination of benzophenone (a conventional photoinitiator), triethanolamine (an organic compound containing a Group V element), and α-6-hexachloroparaxylene (a halogen-containing compound) is considerably faster (Example 8) than the ester alone (Example 1) or the ester with comparable quantities of benzophenone (Example 2), of triethanolamine (Example 3), of α-6-hexachloroparaxylene (Example 4), and of combinations of two of these (Examples 5, 6, and 7).

EXAMPLE 9

The procedure of Examples 3, 5, 6, and 8 was repeated with each of the following instead of triethanolamine: dibutylphenylphosphine, methylbutylphenylarsine, trioctylarsine, tributylbismuthine, triphenylstibine, 4-benzoylpyridine, N-hydroxyethylpiperidine, 1,3-di-4-piperidylpropane, dipiperidinoethane, N-hydroxyethylmorpholine, and 1,3-di-(N-beta-hydroxyethyl-4-piperidyl)propane. The results were comparable.

EXAMPLES 10–16

TABLE II

| Composition, per cent by weight | Example 10 | 11 | 12 | 13 | 14 | 15 | 16 |
|---|---|---|---|---|---|---|---|
| Pentaerythritol tetraacrylate | 94 | 94 | 94 | 94 | 94 | 94 | 94 |
| Benzil | 6 | — | — | 3 | — | 3 | 2 |
| Triphenylphosphine | — | 6 | — | 3 | 3 | — | 2 |
| Pentachlorobenzene | — | — | 6 | — | 3 | 3 | 2 |
| Cure speed, seconds | 13 | 20 | 6 | 3 | 4 | 10 | 1.8 |

From these data it can be seen that the cure speed of pentaerythritol tetraacrylate with a combination of benzil, triphenylphosphine, and pentachlorobenzene is considerably faster (Example 16) than the ester with comparable quantities of the initiators alone (Examples 10, 11, and 12) and of combination of two of the initiators (Examples 13, 14, and 15).

EXAMPLE 17

The procedure of Examples 10, 13, 15, and 16 was repeated with each of the following instead of benzil; benzophenone, benzoin methyl ether, Michler's ketone, and trichloroacetophenone. The results were comparable.

EXAMPLE 18

The procedure of Examples 12, 14, 15, and 16 was repeated with each of the following instead of pentachlorobenzene; hexachloroparaxylene, hexachlorobenzene, and chlorendic anhydride. The results were comparable.

EXAMPLE 19

The procedure of Examples 1 through 18 was repeated with each of the following monomeric compounds instead of pentaerythritol tetraacrylate: pentaerythritol trimethacrylate, 1,4-butylene diacrylate, trimethylolpropane triacrylate, trimethylolethane trimethacrylate, dipentaerythritol hexacrylate, sorbitol triacrylate, sorbitol tetramethacrylate, and isocyanate-modified pentaerythritol triacrylate. The results were comparable.

EXAMPLES 20–26

TABLE III

| Composition, per cent by weight | Example 20 | 21 | 22 | 23 | 24 | 25 | 26 |
|---|---|---|---|---|---|---|---|
| Trimethylolpropane triacrylate | 95 | 95 | 95 | 95 | 95 | 95 | 95 |
| Benzaldehyde | 5 | — | — | 3 | — | 3 | 2 |
| Methyldiethanolamine | — | 5 | | 2 | 3 | — | 2 |
| Chlorinated paraffin resin* | — | — | 5 | — | 2 | 2 | 1 |
| Cure speed, seconds | 8 | 13 | 10 | 5 | 8 | 6 | 2.5 |

*CHLOREZ 700 (Dover Chemical Co.)

From these data it can be seen that the cure speed of trimethylolpropane triacrylate with a combination of benzaldehyde, methyldiethanolamine, and a chlorinated paraffin resin is considerably faster (Example 26) than the ester with comparable quantities of the initiators alone (Examples 20, 21, and 22) and of combinations of two of the initiators (Examples 23, 24, and 25).

EXAMPLE 27

An ink was prepared by grinding on a three-roll mill 85 per cent of the composition of Example 8 and 15 per cent of benzidine yellow. The ink was run on a Miehle press to print coated paper. The printed paper was exposed at a distance of 1¾ inches from three 21-inch 2,100-watt ultraviolet lamps. The ink dried in 0.25 second and had excellent gloss and water resistance.

EXAMPLE 28

The procedure of Example 27 was repeated with each of the following esters instead of pentaerythritol tetraacrylate: pentaerythritol trimethacrylate, isocyanate-modified pentaerythritol triacrylate, 1,4-butylene diacrylate, trimethylolethane triacrylate, and sorbitol tetraacrylate. The results were comparable.

EXAMPLE 29

The procedures of Examples 8, 16, 27, and 28 were repeated except that instead of being exposed to ultraviolet light the samples were passed on a conveyor belt beneath the beam of a Dynacote 300,000-volt linear electron accelerator at a speed and beam current so regulated as to produce a dose rate of 0.5 megarad.

These systems produced resinous materials of varying degrees of hardness in films from 0.5 to 20 mils thick having tacky surfaces.

EXAMPLE 30

The procedures of Examples 8, 16, 27, and 28 were repeated except that instead of being exposed to ultraviolet light the samples were exposed to a combination of ultraviolet light and electron beam radiation in a variety of arrangements as follows: ultraviolet light, then electron beam; electron beam, then ultraviolet light; ultraviolet light before and after electron beam; electron beam before and after ultraviolet radiation; and simultaneous electron beam and ultraviolet light radiation. The results were comparable.

What is claimed is:

1. A photopolymerization co-initiator system which consists essentially of (a) about 1–30 parts of at least one compound having the formula

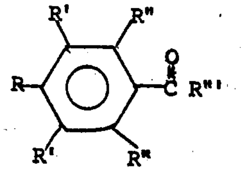

wherein R, R', and R" is each hydrogen, $C_{1-14}$ alkyl, aryl, alkylaryl, alkoxy, aryloxy, halogen, halogenated $C_{1-14}$ alkyl, halogenated aryl, amino, or amino N-substituted with alkyl, aryl, β-alkanol, or a combination of these, and may be the same or different; and R''' is hydrogen, $C_{1-14}$ alkyl, halogenated alkyl, aryl, —OZ where Z is $C_{1-14}$ alkyl or aryl;

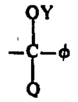

where Y is hydrogen, $C_{1-14}$ alkyl, aryl, or alkylaryl and Q is hydrogen, $C_{1-14}$ alkyl, aryl, alkylaryl, alkoxy, or aryloxy; or

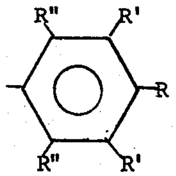

wherein R, R′, and R″ is each hydrogen, $C_{1-14}$ alkyl, aryl, alkylaryl, alkoxy, aryloxy, halogen, halogenated $C_{1-14}$ alkyl, halogenated aryl, amino, or amino N-substituted with alkyl, aryl, β-alkanol, or a combination of these, and may be the same or different; (b) about 1–30 parts of at least one compound having the formula

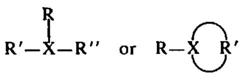

wherein X is nitrogen, phosphorus, arsenic, bismuth, or antimony and R, R′, and R″ is each alkyl, hydroxyalkyl, aryl, aralkyl, or alkaryl and may be the same or different and one or both of R and R″ may be hydrogen; and (c) 1–30 parts of at least one halogenated hydrocarbon.

2. The co-initiator of claim 1 wherein the ratio of (a):(b):(c) is about 2–15:2–10:1–5.

* * * * *